United States Patent
Salsman et al.

(10) Patent No.: US 7,288,873 B2
(45) Date of Patent: Oct. 30, 2007

(54) DEVICE FOR EMISSION OF HIGH FREQUENCY SIGNALS

(75) Inventors: Kenneth E. Salsman, Pleasanton, CA (US); Daniel W. So, Palo Alto, CA (US)

(73) Assignee: Scenterra, Inc., Bowie, MD (US)

( * ) Notice: Subject to any disclaimer, the term of this patent is extended or adjusted under 35 U.S.C. 154(b) by 0 days.

(21) Appl. No.: 11/285,328

(22) Filed: Nov. 21, 2005

(65) Prior Publication Data

US 2006/0109181 A1    May 25, 2006

Related U.S. Application Data

(63) Continuation-in-part of application No. 11/157,272, filed on Jun. 20, 2005.

(60) Provisional application No. 60/522,920, filed on Nov. 20, 2004, provisional application No. 60/522,921, filed on Nov. 20, 2004, provisional application No. 60/522,922, filed on Nov. 20, 2004, provisional application No. 60/522,923, filed on Nov. 20, 2004, provisional application No. 60/522,924, filed on Nov. 20, 2004, provisional application No. 60/522,925, filed on Nov. 20, 2004.

(51) Int. Cl.
H01L 41/00 (2006.01)
H01Q 1/26 (2006.01)
G01P 15/00 (2006.01)

(52) U.S. Cl. ............ 310/322; 310/323.06; 73/514.36; 343/701

(58) Field of Classification Search ............ 73/514.36; 343/701; 310/322, 334, 323.06
See application file for complete search history.

(56) References Cited

U.S. PATENT DOCUMENTS

| | | | |
|---|---|---|---|
| 4,348,681 A * | 9/1982 | McVeigh et al. | ........... 342/372 |
| 4,665,363 A | 5/1987 | Extance et al. | |
| 5,018,865 A | 5/1991 | Ferrell et al. | |
| 5,073,782 A | 12/1991 | Huguenin et al. | |
| 5,445,008 A | 8/1995 | Wachter et al. | |
| 5,483,338 A | 1/1996 | Wachter et al. | |
| 5,719,324 A | 2/1998 | Thundat et al. | |
| 5,745,437 A | 4/1998 | Wachter et al. | |
| 5,756,895 A | 5/1998 | Kubena et al. | |
| 5,829,448 A | 11/1998 | Fisher et al. | |
| 5,832,931 A | 11/1998 | Wachter et al. | |
| 5,889,490 A | 3/1999 | Wachter et al. | |
| 5,905,202 A | 5/1999 | Kubena et al. | |
| 5,918,263 A | 6/1999 | Thundat | |
| 5,998,597 A | 12/1999 | Fisher et al. | |
| 6,005,400 A | 12/1999 | Thundat et al. | |
| 6,016,686 A | 1/2000 | Thundat | |
| 6,042,603 A | 3/2000 | Fisher et al. | |
| 6,050,722 A | 4/2000 | Thundat et al. | |
| 6,096,559 A | 8/2000 | Thundat et al. | |
| 6,109,105 A | 8/2000 | Kubena et al. | |
| 6,118,124 A | 9/2000 | Thundat et al. | |
| 6,167,748 B1 | 1/2001 | Britton, Jr. et al. | |
| 6,212,939 B1 | 4/2001 | Thundat | |

(Continued)

*Primary Examiner*—Thanh X. Luu
*Assistant Examiner*—Brian J Livedalen
(74) *Attorney, Agent, or Firm*—Matthew J. Esserman (57) ABSTRACT

A device for emission of high frequency signals is provided. The emission device is capable of emission of signals in the Gigahertz (GHz) and Terahertz (THz) range. The device may utilize, for example, a cantilever comprising a material that is capable of altering its electrical properties when flexed.

34 Claims, 9 Drawing Sheets

Piezoelectric MEMS Oscillation Pulse Generating Device

U.S. PATENT DOCUMENTS

| Patent Number | | Date | Inventor(s) | |
|---|---|---|---|---|
| 6,263,734 | B1 | 7/2001 | Fujii et al. | |
| 6,263,736 | B1 | 7/2001 | Thundat et al. | |
| 6,289,717 | B1 | 9/2001 | Thundat et al. | |
| 6,311,549 | B1 | 11/2001 | Thundat et al. | |
| 6,311,557 | B1 | 11/2001 | Davis et al. | |
| 6,325,904 | B1 | 12/2001 | Peeters | |
| 6,330,824 | B1 | 12/2001 | Erie et al. | |
| 6,331,286 | B1 | 12/2001 | Dees et al. | |
| 6,336,366 | B1 | 1/2002 | Thundat et al. | |
| 6,433,543 | B1 | 8/2002 | Shahinpoor et al. | |
| 6,436,346 | B1 | 8/2002 | Doktycz et al. | |
| 6,444,972 | B1 | 9/2002 | Datskos et al. | |
| 6,519,076 | B2 | 2/2003 | Fisher et al. | |
| 6,525,862 | B2 | 2/2003 | Fisher et al. | |
| 6,545,495 | B2 | 4/2003 | Warmack et al. | |
| 6,545,785 | B1* | 4/2003 | Heflinger et al. | 398/201 |
| 6,552,339 | B1 | 4/2003 | Gupta et al. | |
| 6,646,275 | B2 | 11/2003 | Oae et al. | |
| 6,650,319 | B1 | 11/2003 | Hurst et al. | |
| 6,716,638 | B1 | 4/2004 | Hsiung | |
| 6,737,648 | B2 | 5/2004 | Fedder et al. | |
| 6,763,705 | B1 | 7/2004 | Thundat et al. | |
| 6,770,882 | B2 | 8/2004 | Carr et al. | |
| 6,831,747 | B2 | 12/2004 | Ferrell et al. | |
| 6,851,297 | B2 | 2/2005 | Cunningham et al. | |
| 6,860,939 | B2 | 3/2005 | Hartzell | |
| 6,864,692 | B1 | 3/2005 | Patel et al. | |
| 6,933,164 | B2* | 8/2005 | Kubena | 438/49 |
| 7,109,730 | B2 | 9/2006 | Slupsky | |
| 7,125,451 | B2 | 10/2006 | Hartzell | |
| 7,128,783 | B2 | 10/2006 | Hartzell | |
| 7,135,070 | B2 | 11/2006 | Hartzell | |
| 7,156,916 | B2 | 1/2007 | Hartzell | |
| 2003/0011285 | A1* | 1/2003 | Ossmann | 310/334 |
| 2003/0196591 | A1 | 10/2003 | Hartzell | |
| 2005/0130360 | A1* | 6/2005 | Zhan et al. | 438/197 |
| 2005/0162040 | A1* | 7/2005 | Robert | 310/322 |
| 2006/0051884 | A1 | 3/2006 | McNamara et al. | |
| 2006/0238239 | A1 | 10/2006 | Zalalutdinov et al. | |

* cited by examiner

FIG. 1

High Frequency Pulse Generation

FIG. 2A

Piezoelectric MEMS Pulse Generation Signal

FIG. 2B

Piezoelectric MEMS Oscillation Pulse Generating Device

Piezoelectric MEMS Oscillation Pulse Generation Signal

DEVICE FOR EMISSION OF HIGH FREQUENCY SIGNALS

This application claims priority from provisional application 60/522,920, filed Nov. 20, 2004. This application is also a continuation-in-part of U.S. patent application Ser. No. 11/157,272, filed Jun. 20, 2005, which claims priority from provisional application 60/522,921, filed Nov. 20, 2004, provisional application 60/522,922, filed Nov. 20, 2004, provisional application 60/522,923, filed Nov. 20, 2004, provisional application 60/522,924, filed Nov. 20, 2004, and provisional application 60/522,925, filed Nov. 20, 2004.

FIELD OF THE INVENTION

The present invention is a device, or family of devices, designed for emitting high frequency and RF signals, and more particularly for emitting RF signals in the gigahertz and terahertz regions.

BACKGROUND OF THE INVENTION

The Gigahertz (GHz) and Terahertz (THz) regions of the microwave spectrum have been identified as an area where macro molecule resonances may be detected without destructive ionization of the original molecules. Of particular interest is the ability to stimulate the molecular vibration of large molecules in applications ranging from medical sensing to bio-terrorism warning sensors. Schemes for generating signals in these regions have primarily relied on the use of standard or exotic semiconductor materials or RF emissions generated by laser induced resonance in specific crystals. For high frequencies these devices require the formation of quantum wells and/or dots or require that the resonant crystal be machined in a specific shape. These approaches provide a narrow frequency response per device or, for the laser pumped crystal devices, they can be tuned over a narrow bandwidth via frequency shifting of the lasers used to stimulate the crystal.

Therefore a need exists for an emitter capable of operating over a broadband and able to provide the frequency tuning required for spectral analysis. Further, a device design capable of being used in communication and networking is also needed.

BRIEF SUMMARY OF THE INVENTION

An emitter of RF radiation, the emitter comprising: a cantilever electrically coupled to an antenna, wherein one or more cantilever is driven by electrical signals to produce an electrical oscillation for RF emission; the cantilever constructed so that it comprises a piezoelectric film between conductive layers; and drive electrodes arranged so that the cantilever can be driven to emit electrical pulses as the piezoelectric film is stressed. Alternatively, a box-type structure or other mechanical architecture capable of stressing the piezoelectric film may be employed in place of the cantilever. The emitter is capable of emitting RF signals in the MHz, GHz and THz regions.

BRIEF DESCRIPTION OF THE SEVERAL VIEWS OF THE DRAWINGS

Understanding of the present invention will be facilitated by consideration of the following detailed description of the preferred embodiments of the present invention taken in conjunction with the accompanying drawings, in which like numerals refer to like parts and in which.

DETAILED DESCRIPTION OF THE INVENTION

It is to be understood that the figures and descriptions of the present invention have been simplified to illustrate elements that are relevant for a clear understanding of the present invention, while eliminating, for the purpose of clarity, many other elements found in typical emitting devices. Those of ordinary skill in the art may recognize that other elements and/or steps are desirable and/or required in implementing the present invention. However, because such elements and steps are well known in the art, and because they do not facilitate a better understanding of the present invention, a discussion of such elements and steps is not provided herein. The disclosure herein is directed to all such variations and modifications to such elements and methods known to those skilled in the art.

The present invention may provide a high frequency emitter capable of working across a broadband frequency range and may be able to provide frequency scanning, thereby simplifying the electronics required for spectral analysis. Further, the device of the present invention may be designed to have a variety of gains to be used in a wide variety of environments and applications.

A mechanically controllable membrane, such as a microelectromechanical system (MEMS) for example, may be used. MEMS are typically integrated micro devices or systems combining electrical and mechanical components, fabricated using integrated circuit processing techniques and may range in size from nanometers to millimeters. These systems may sense, control and actuate on the micro scale, and may function individually or in arrays to generate effects on the macro scale.

A MEMS may include a base and a deflector. The base (or substrate) and deflector may be made from materials such as, for example, InP, GaAs, SiN, Si, or $SiO_2$. The MEMS may operate wherein an application of energy to the MEMS causes a longitudinal deflection of the deflector with respect to the base. The longitudinal displacement of the deflector from the base is proportional to the energy applied to the MEMS. A wide variety of MEMS structures may be applicable to this emitting technique. While only a few select varieties of structures are described in detail herein, other structures, such as rocking arms and flexible diaphragms, for example, may be designed to vary oscillation based upon the charge differential imposed on a conductive element by a received RF signal. MEMS can be integrated into devices which have mechanical advantages and therefore can increase the gain of the emitted signal. In addition, it may be possible to utilize multiple MEMS in series to create a continuous wave emission, amplify the power of a pulse or alter the waveform of the pulse being emitted. Magnetic fields may be used instead of electrical fields, by utilization of alternative materials such as magneto-strictive materials.

The device of the present invention may be fabricated on a variety of materials, including silicon, for example. The size of the elements may be variable so that this type of emitter may be fabricated for use over wide frequency ranges with particular central frequencies. In addition, the power level of this MEMS emitter may be increased, for example, by changing the dimensions and/or size of the piezoelectric film of the MEMS structures. Designing the MEMS to resonate at a specific RF frequency may also increase the power emitted, especially at that frequency. By the use of multiple MEMS elements that are preferably connected in series with a specific or controllable delay between the MEMS, it is possible that arrays of these MEMS elements can amplify the signal emitted by the initial element, add additional waveforms to the initial pulse, change the shape of the waveform, or change its frequency.

In a preferred embodiment, a specific signal architecture that lends itself to high frequency signal generation is the incorporation of two square wave signals in a manner that allows them to be combined out of phase. An example of this is where the two square waves are at the same frequency (note this is not a requirement) and set to be 175 degrees out of phase. When these two signals are combined, the result is a set of very short pulses that occur at twice the frequency of the original waveforms. (i.e. Considering both negative and positive). These pulses occur at each transition edge of the original wave forms and have a pulse width equivalent to the 5 degree period between the combination phase and the 180 degree phase position where the two waveforms would cancel each other out. The resulting pulses alternate between positive and negative values and are separated by half the cycle time of the generation signals. By combining multiples of these pulse generators, each at a slight delay from each other, a continuous alternating current signal can be produced at significantly higher frequencies than the waveforms used to generate the signal. For example, using modern computer clock chips and digital timing controls, drive signals of 1 GHz or higher are available per chip. By using a DC offset, two of these PC clock devices can supply a 1 GHz square wave signal. However, there are a wide variety of methods for generating these initial waveforms. The initiation of these drive signals can be controlled with an accuracy of 128 bits for example. In this manner, the resulting high frequency generation in this example can be up to pulse widths of 4 picoseconds or 0.25 Thz. By using multiple circuits of this configuration and controlling the initiation timing of the clocks, it is possible to generate a continuous signal at this high frequency. An additional advantage of this approach to high frequency generation is that the signal power can be applied at the lower drive frequencies and/or by combining signals from an array of similar circuits. This allows the electrical components used to generate the high frequency to operate at comparative low frequencies that reduce their cost and power restrictions.

MEMS devices that can emit short electrical pulses can also be used in this same manner. An example of this is a MEMS cantilever that is composed of two conductive films that have a piezoelectric film between them. In this configuration, the piezoelectric material acts as an insulator when the cantilever is not stressed and then emits a short pulse when the cantilever is flexed. Since the piezoelectric film emits this pulse every time that the cantilever is stressed, in either direction, the pulses occur at twice the oscillation frequency of the MEMS structure. Piezoelectric materials emit a pulse of one polarity when they are initially stressed and emit a second pulse of the opposite polarity when returning to the relaxed state. As in the previous description of square wave or timing pulse generation of high frequency pulses the MEMS structure can be designed to generate pulses of opposite polarity that are spaced apart by a time delay or the design can be set to use the MEMS element as a capacitive discharge device where the initial drive signal causes the piezoelectric material to stress and pulse at the same time that the cantilever discharges its field difference with the drive signal. In this case, the second opposite pulse can occur without a delay as the piezoelectric material relaxes back to its original position and therefore provides a full mono-pulse at the higher frequency generated by the timing width of the piezoelectric discharge. Again, as described previously, the use of multiple MEMS elements of this type can be used to generate a continuous high frequency emission. Also, since the piezoelectric mono-pulse is fully bidirectional, an antenna placed across the device will receive a full modulation and emit RF energy. As a result, the MEMS devices act as active RF circuit elements.

As mentioned previously, the piezoelectric MEMS devices can be structured to emit mono-pulses that are fully bidirectional in charge. As a result, a signal generated by one that is sent to a second can be amplified if the second piezoelectric MEMS is discharged with the correct timing. Therefore, an array of these devices connected in series with the correct timing can be used as a power amplifier. By altering the timing of the elements in this series, the pulse shape can be altered and controlled. With MEMS elements that are driven without the ability to rapidly discharge, the timing of the MEMS elements can be used to alter the width of the waveform resulting in a change in the output frequency of the array. Thus, depending on the drive scheme and the MEMS architecture, an array can be designed to amplify power, perform waveform shaping functions or alter its output frequency.

Additional techniques can be employed using hot electron transfer or capacitive switching that employ architectures of electrodes that allow the MEMS structure to pass by them and therefore cause an electrical breakdown or electrical transfer whose time period is controlled by the rate of passage of the MEMS element or by the discharge or passage of a specific electrical potential. In this manner, the oscillation is triggered by the MEMS device. A specific example of this type of structure is a cantilever that is driven in oscillation by one circuit and is charged with an electrical potential by a second circuit. By using one electrode to control the oscillation drive and a second that acts as the discharge point electrode, the MEMS will discharge only when it is in sufficient range of the second discharge electrode. As the MEMS element passes the discharge distance, the transfer of electrons between the moving element and the electrode is limited in time. By placing insulation structures around the electrode and designing the MEMS element for a specific speed, the timing of this discharge period can be precisely controlled.

Piezoelectric MEMS can also be used to cause breakdown of the electron tunneling layer within a diode that is held near its breakdown potential. These MEMS can also be used to activate the gate on transistors, thereby opening the transistor so that current can flow across it. In both of these situations the architecture of the MEMS element can be designed in a manner to minimize the time that this switching event occurs and then based upon the characteristics of the diode or transistor, the switching times can be extremely short. If these devices are part of a high frequency oscillation circuit the result is that the MEMS then controls the frequency of oscillation and the timing of the oscillator.

The present invention may also provide for an emitter that is capable of being fabricated in high volume and at low cost for use in MHz, GHz and THz products, such as communications, computing, data networking, bio-threat and chemical sensors. The present invention may provide the ability to up-convert RF signals at a lower frequency to a higher frequency. It is also possible that the current invention can be incorporated directly into an antenna or waveguide to be an integral part of the transmission structure.

Figure 1:
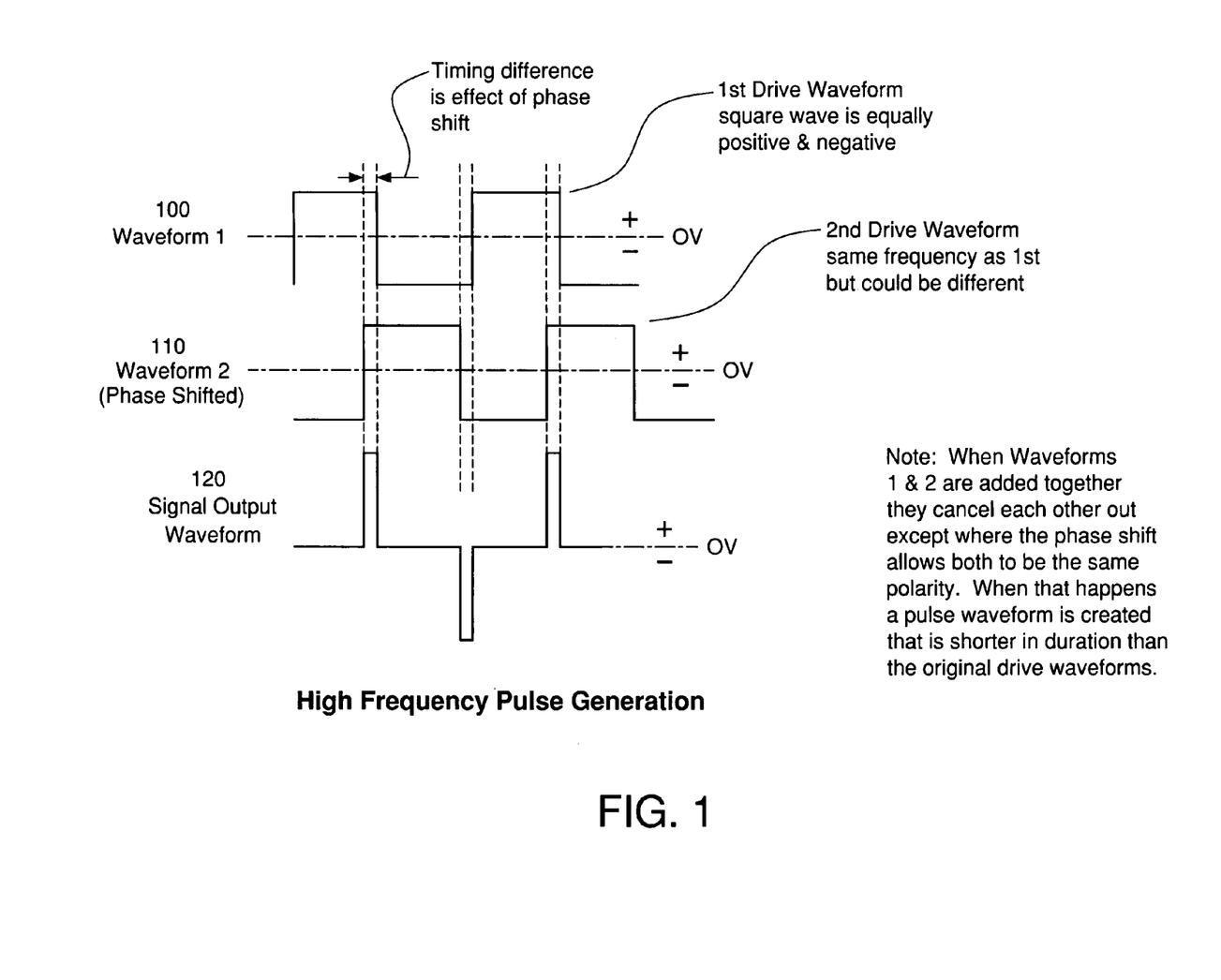
FIGS. 1-6 illustrate various embodiments of devices capable of emission of high frequency signals, in accordance with preferred embodiments of the present invention.

As illustrated in FIG. 1, a preferred embodiment is shown as a balanced signal around zero volts. This is used as an example since the approach will work at any voltage bias. Waveform 1 (reference numeral 100) is a square wave signal (i.e. pulse) with Waveform 2 (reference numeral 110) of the same nature but as shown there is a phase difference wherein the positive, or upward, part of the wave in Waveform 1 coincides primarily with the negative, or downward, part of Waveform 2. The exception to this relationship is shown between the narrower portion of the dotted lines and is where both waveforms have the same orientation (either positive or negative). Waveforms 1 and 2 are out of phase with each other by an amount not equal to 180 degrees. As shown by the Signal Output Waveform 120, when Waveform 1 and Waveform 2 are added together the result is that over the region where the Waveforms 1 and 2 are oriented in opposite directions they cancel out. Where they have the same orientation, i.e. within the narrower dotted line region, they combine in magnitude as shown in the Signal Output Waveform 120. In this manner, low frequency waveforms such as Waveform 1 and 2 can be used to generate high frequency pulses at higher magnitudes that have blanking or neutral periods between them.

Figure 2A:
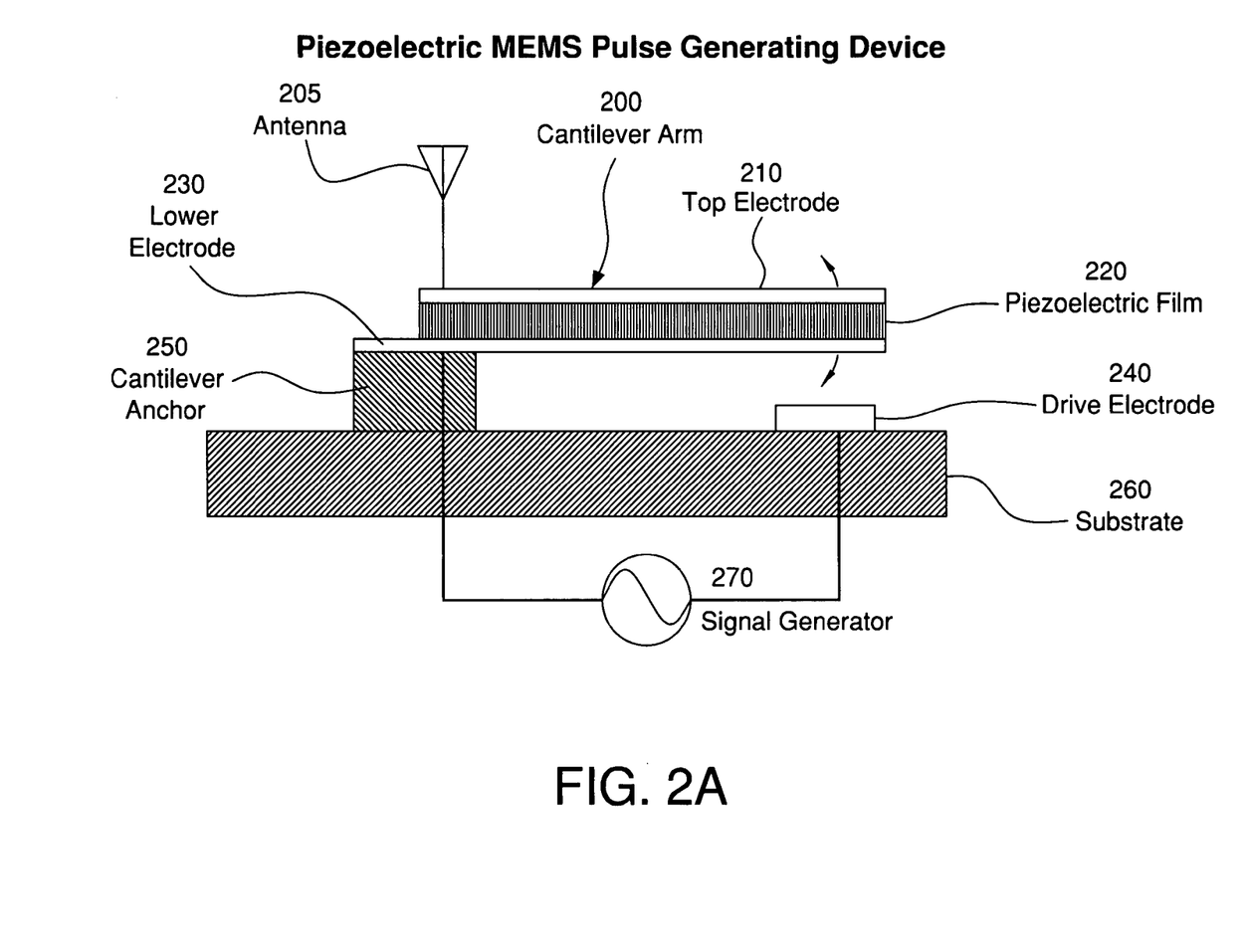
Figure 2B:
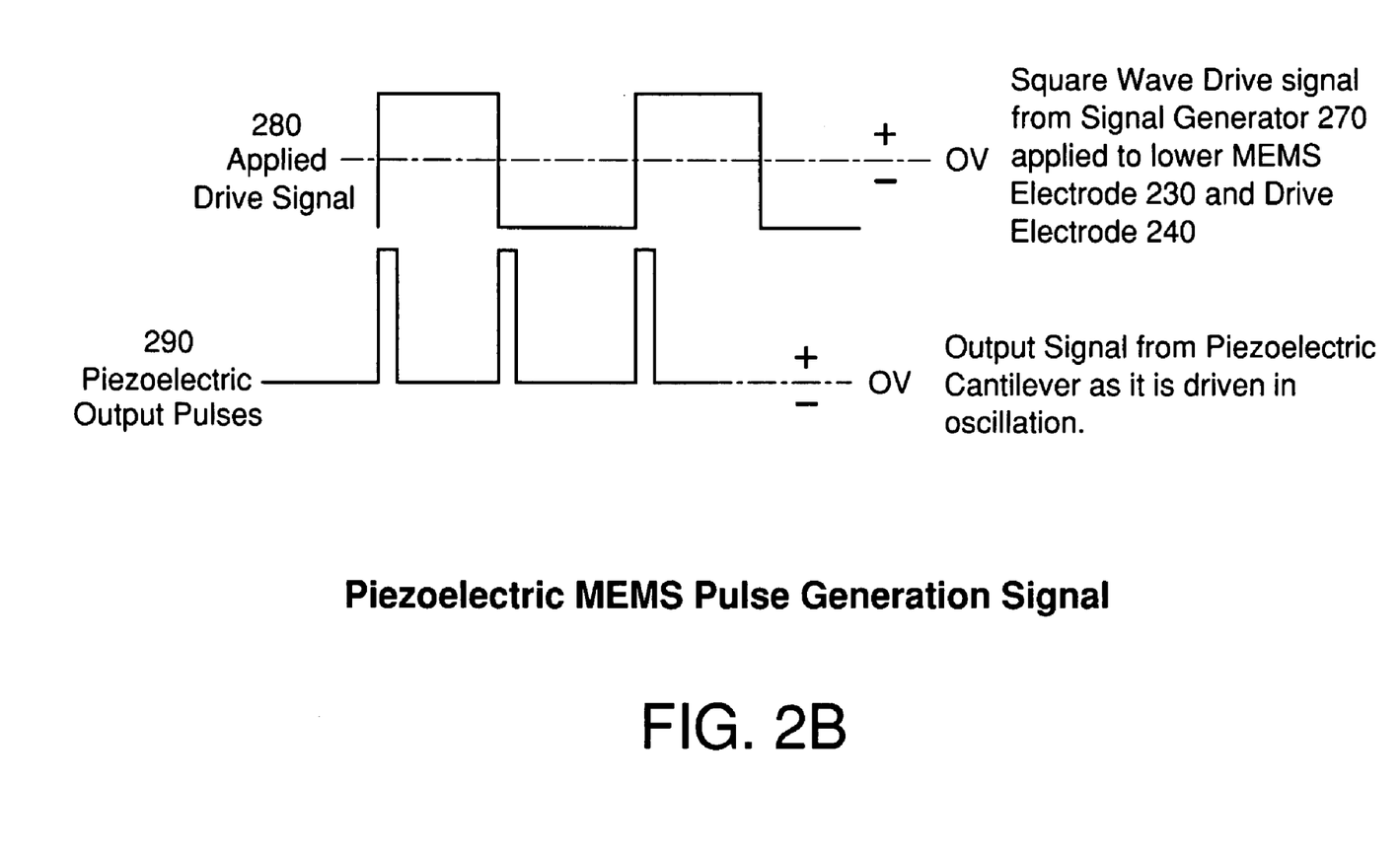

FIG. 2A illustrates a piezoelectric MEMS pulse generating device which includes a cantilever arm 200 (referred to as cantilever 200). Cantilever 200 comprises a top electrode 210, a piezoelectric film/layer 220, and a lower electrode 230. The cantilever is supported by a substrate 260 via a cantilever anchor 250. Associated with the moving end of the cantilever (i.e. the end opposite the cantilever anchor 250) is a drive electrode 240. An electrical signal (i.e. applied drive signal 280 as shown in FIG. 2B) is supplied by signal generator 270 which is applied to the lower electrode 230 with the opposite side of the potential of the signal applied to the drive electrode 240. This application of the drive signal 280 then causes the cantilever to experience attractive and repulsive forces as the charges on the drive electrode 240 and the lower electrode 230 change with the drive signal. This causes the cantilever to undergo physical oscillations resulting in the cantilever vibrating at the rate of the signal from the signal generator 270. This oscillation induces a strain in the piezoelectric film 220 which in response emits piezoelectric output pulses 290 between the top electrode 210 and the lower electrode 230.

Figure 3A:
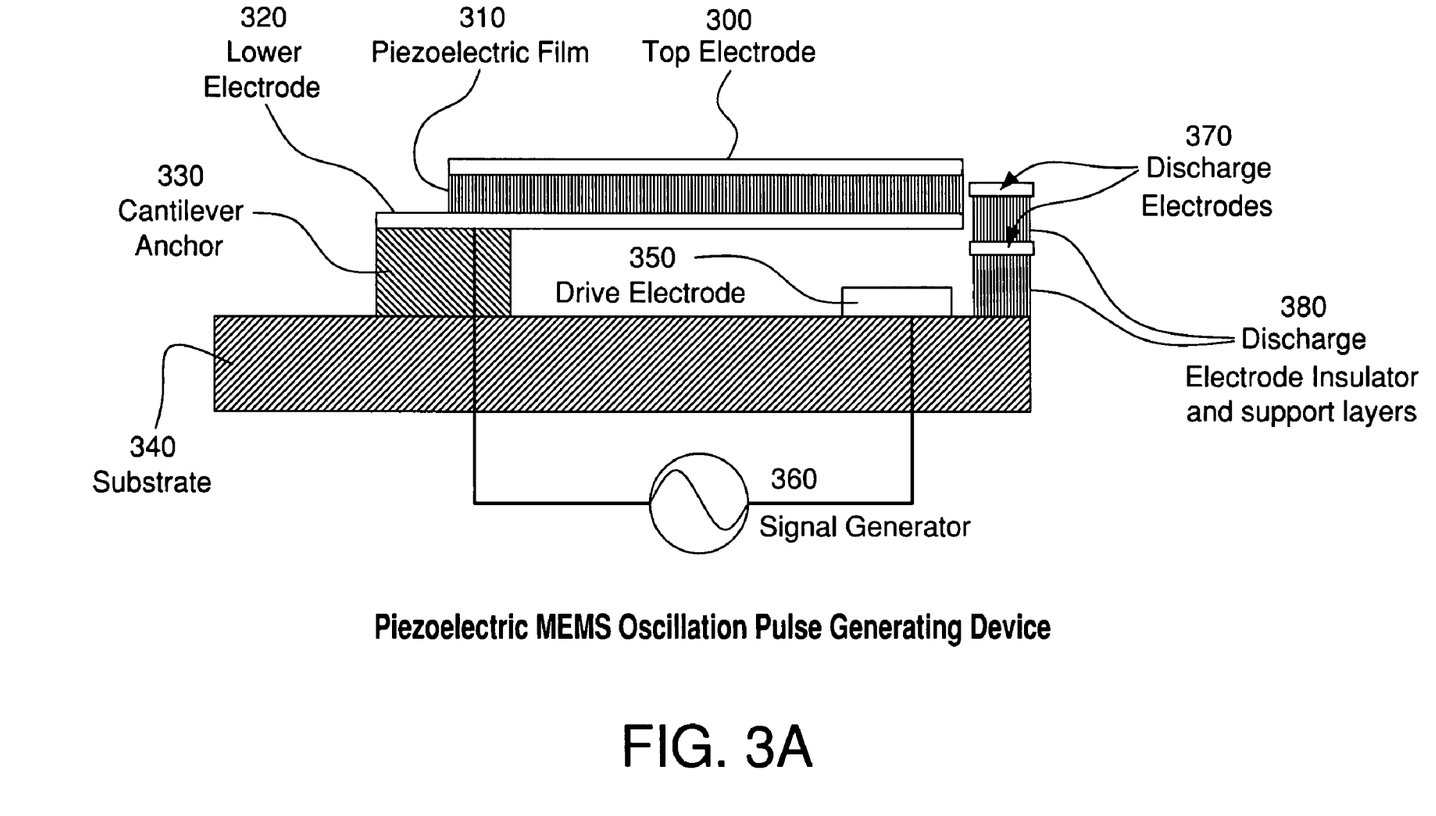
Figure 3B:
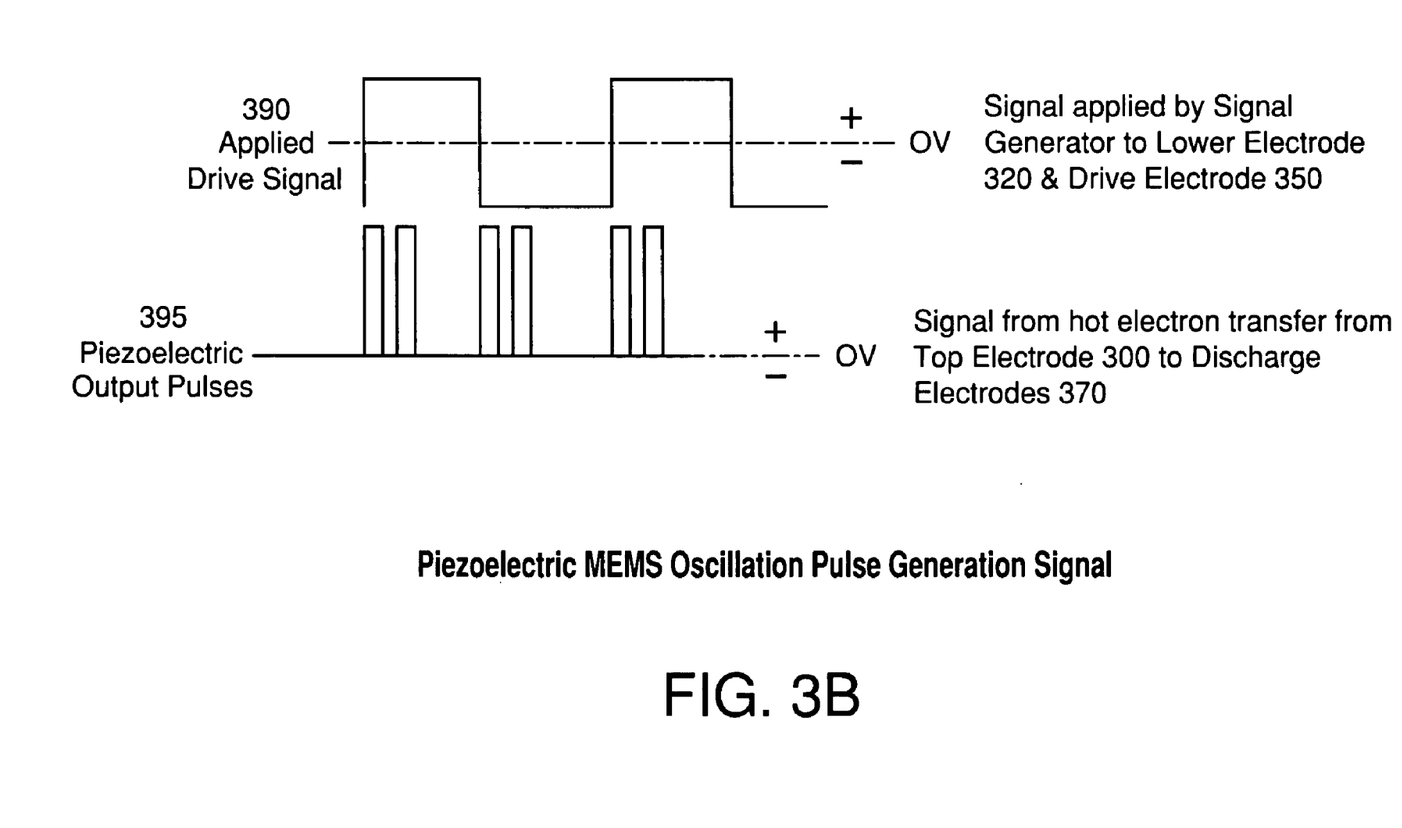

FIG. 3A illustrates a piezoelectric MEMS oscillation pulse generating device which includes a cantilever. The cantilever comprises a top electrode 300, a piezoelectric film/layer 310, and a lower electrode 320. The cantilever is supported by a substrate 340 via a cantilever anchor 330. Associated with the moving end of the cantilever is a drive electrode 350. An electrical signal (i.e. applied drive signal 390 as shown in FIG. 3B) is supplied by signal generator 360 which is applied to the lower electrode 320 with the opposite side of the potential of the signal applied to the drive electrode 350. This application of the drive signal 390 then causes the cantilever to experience attractive and repulsive forces as the charges on the drive electrode 350 and the lower electrode 320 change with the drive signal. This causes the cantilever to undergo physical oscillations resulting in the cantilever vibrating at the rate of the signal from the signal generator 360. This oscillation induces a strain in the piezoelectric film 310 which generates potential between the top electrode 300 and the lower electrode 320. Near the moving end of the cantilever there are stacked discharge electrodes 370 which are separated by discharge electrode insulator and support layers 380. As the cantilever oscillates and the piezoelectric film 310 generates electrical pulses from the mechanical strain of the oscillation, the electrical charge on the piezoelectric film, top electrode 300, and lower electrode 320 transfer the charge via hot electron transfer to the discharge electrodes 370. The resulting output is the piezoelectric output pulses shown 395 (FIG. 3B).

Figure 4:
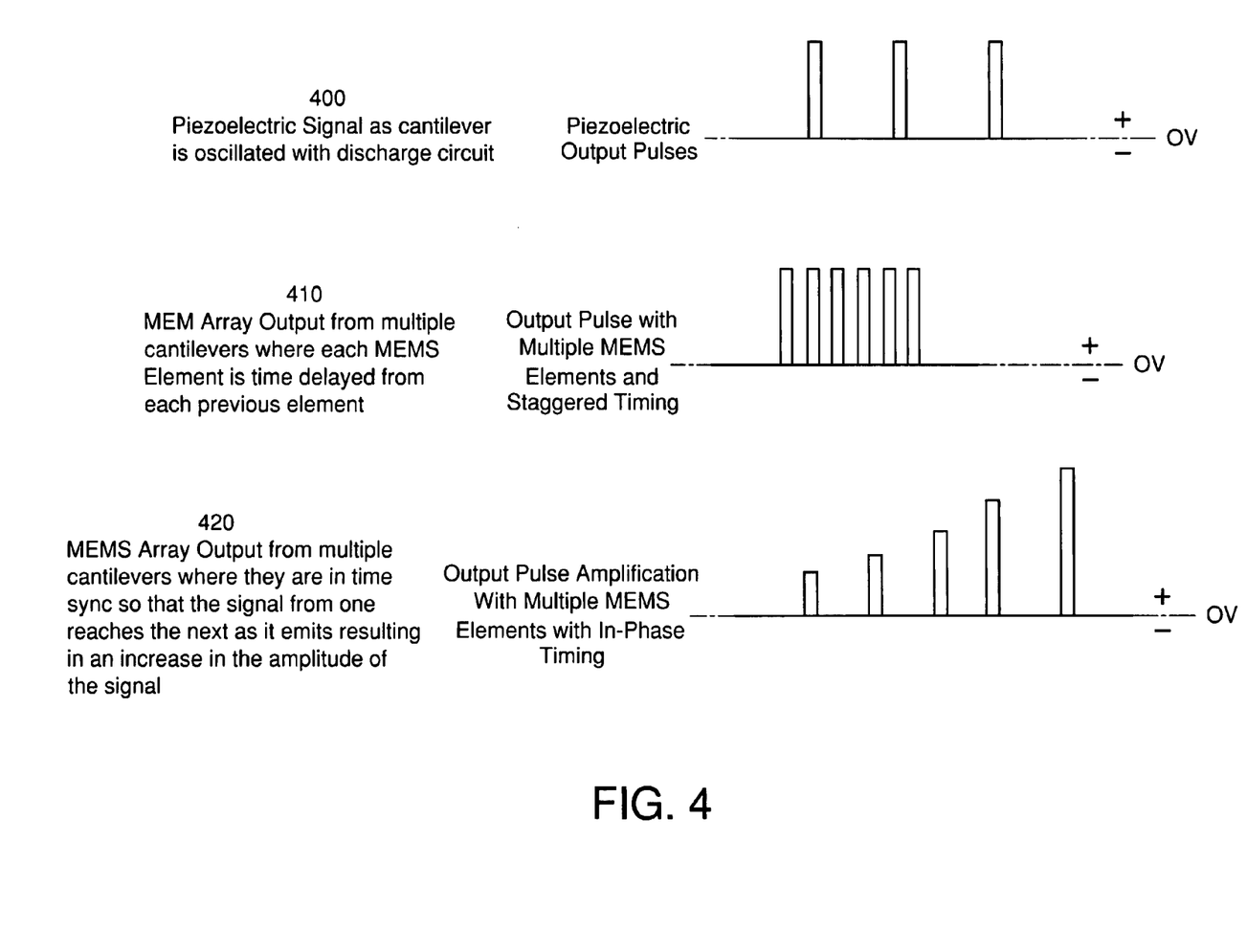

Electrical signals from devices such as those shown in FIGS. 2A and 3A can produce waveforms with high frequency pulses of complete waveforms 400 (as illustrated in FIG. 4) that have a neutral period between the pulse waveforms. By connecting a plurality of these devices/elements (as in FIGS. 2A and 3A) in such a manner that they have a delay between each such that the output waveform from the first device reaches the second device just prior to the emission of a waveform from the second device, it is possible to create a phased addition resulting in the generation of a continuous waveform 410. Similarly, by connecting multiple devices so that their emitted waveforms coincide (i.e. are in phase), the amplitude of the output pulse signal can be increased 420.

Figure 5:
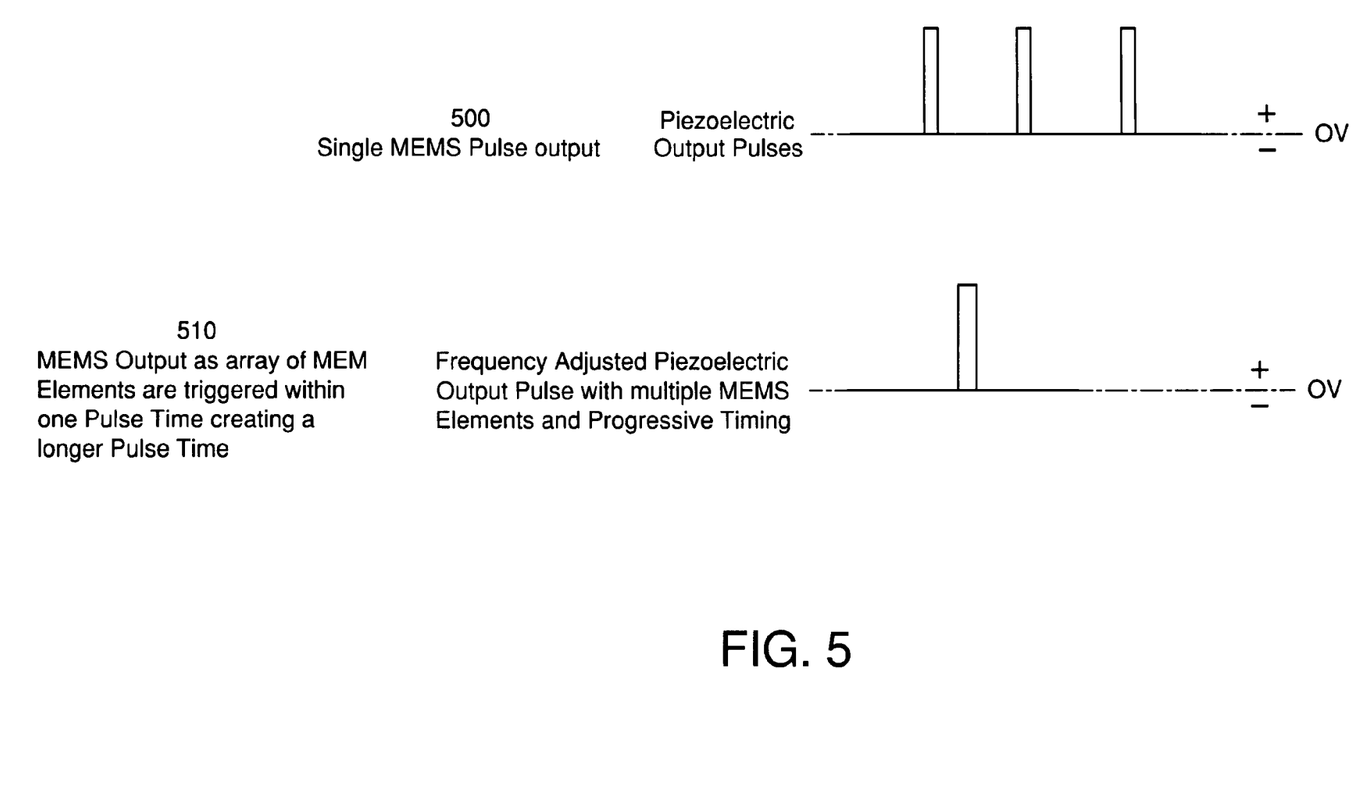

The electrical signal from a single device such as shown in FIG. 2A or FIG. 3A has the electrical signal output of short pulse widths with an intervening neutral period 500 as illustrated in FIG. 5. By the application of a drive signal with a short hold period at a specific voltage, it is possible to generate signals where the upward waveform and the downward waveform are slightly separated. When these are combined in the correct phase with the output signal from an element as shown in FIG. 2A or 3A, the width of the output pulses may be increased (510-FIG. 5) thereby lowering its relative frequency and increasing the wavelength. Multiple elements may be applied in this manner to vary the wavelength of the output signal.

Figure 6A:
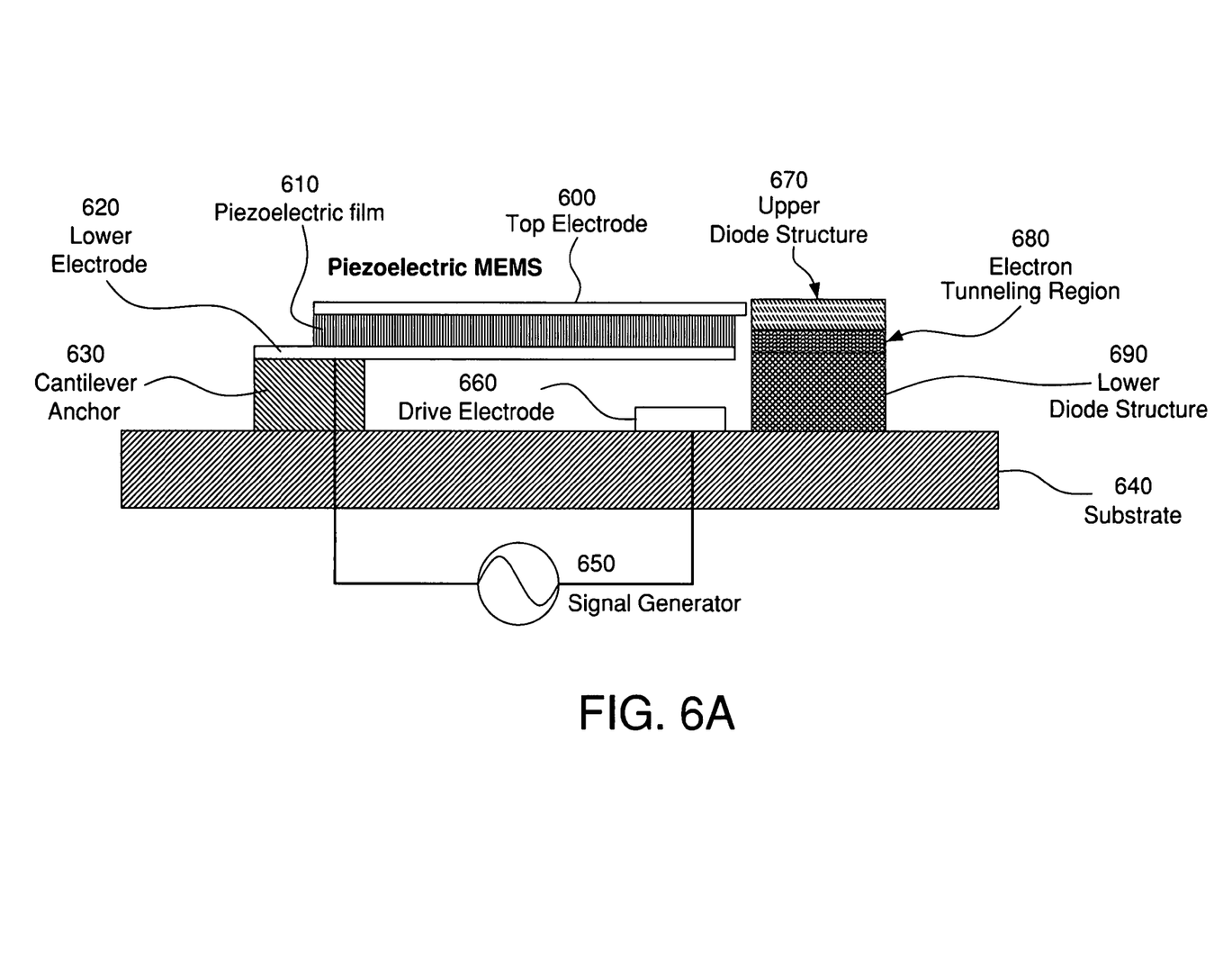

FIG. 6A illustrates a piezoelectric MEMS device which includes a cantilever. The cantilever comprises a top electrode 600, a piezoelectric filmllayer 610, and a lower electrode 620. The cantilever is supported by a substrate 640 via a cantilever anchor 630. Associated with the moving end of the cantilever is a drive electrode 660. An electrical signal (i.e. applied drive signal) as per FIGS. 2B and 3B is supplied by signal generator 650 which is applied to the lower electrode 620 with the opposite side of the potential of the signal applied to the drive electrode 660. This application of a drive signal then causes the cantilever to experience attractive and repulsive forces as the charges on the drive electrode 660 and the lower electrode 620 change with the drive signal. This causes the cantilever to undergo physical oscillations resulting in the cantilever vibrating at the rate of the signal from the signal generator 650. This oscillation induces a strain in the piezoelectric film 610 which generates potential between the top electrode 600 and the lower electrode 620. Near the moving end of the cantilever is a semiconductor structure (i.e. a diode). The diode comprises an upper diode structure 670, an electron tunneling region 680, and a lower diode structure 690. As in FIGS. 2A and 3A, the piezoelectric film 610 is stressed and generates charges on the top electrode 600 and lower electrode 620. If there is a sufficient potential charge across the upper diode structure 670, the electron tunneling region 680, and the lower diode structure 690, then the field strength and/or hot electron transfer from the top electrode 600 will cause a breakdown in the electron tunneling region 680 of the diode causing the device to allow current to pass through it. As the cantilever moves out of the region, the diode is allowed to reconstitute its charge structure and stop the passage of current. In this configuration, the cantilever acts in a similar manner to the gate structure in a transistor. This allows extremely rapid switching of the diode and control of the switching by the oscillation frequency of the cantilever.

Figure 6B:
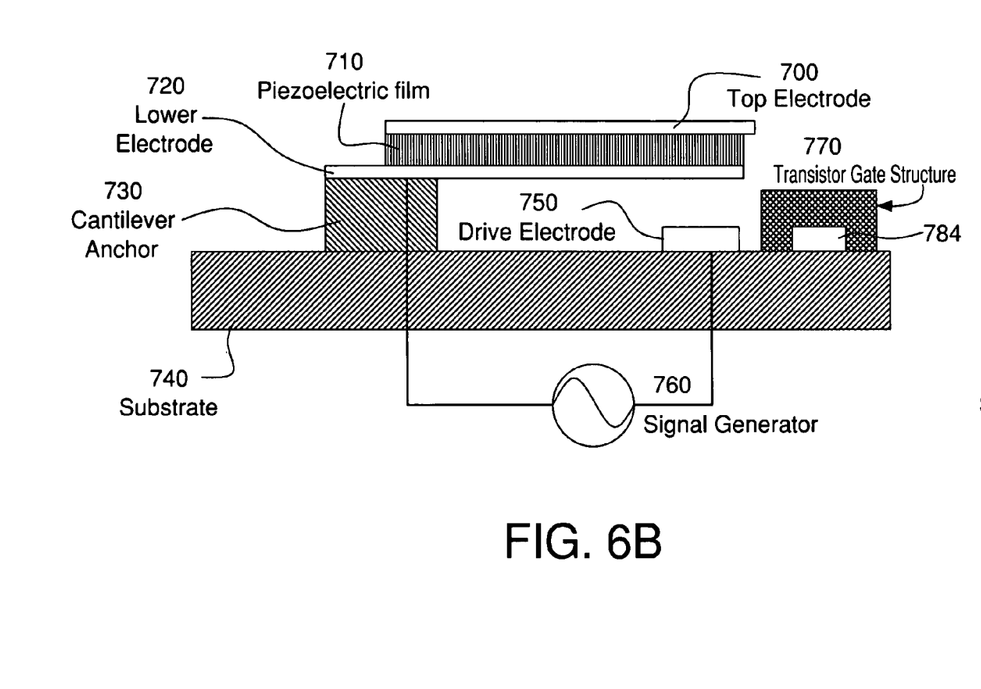
Figure 6C:
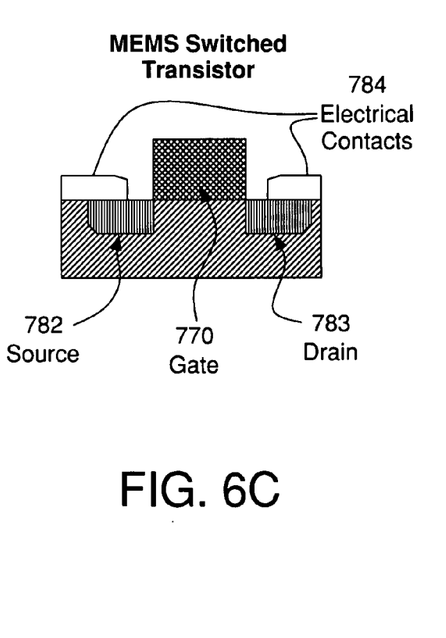

FIG. 6B illustrates a piezoelectric MEMS device which includes a cantilever. The cantilever comprises a top electrode 700, a piezoelectric film/layer 710, and a lower electrode 720. The cantilever is supported by a substrate 740 via a cantilever anchor 730. Associated with the moving end of the cantilever is a drive electrode 750. An electrical signal (i.e. applied drive signal) as per FIGS. 2B and 3B is supplied by signal generator 760 which is applied to the lower electrode 720 with the opposite side of the potential of the signal applied to the drive electrode 750. This application of a drive signal then causes the cantilever to experience attractive and repulsive forces as the charges on the drive electrode 750 and the lower electrode 720 change with the drive signal. This causes the cantilever to undergo physical oscillations resulting in the cantilever vibrating at the rate of the signal from the signal generator 760. This oscillation induces a strain in the piezoelectric film 710 which generates potential between the top electrode 700 and the lower electrode 720. Near the moving end of the cantilever is a semiconductor structure (i.e. a transistor). The transistor composes a gate 770 (see also FIG. 6C which is an enlarged cross-sectional view of the transistor portion of FIG. 6B and which is rotated 90 degrees) where the top electrode 700 can impact the switching of the transistor via hot electron transfer. Upon receiving the electron transfer from the cantilever, the gate 770 of the transistor (which further comprises a source 782 and a drain 783) will open the transistor and allow electrical signals to flow between the electrical contacts 784. In this manner, the transistor switching is controlled by the oscillation frequency of the cantilever. Control of the timing of the switching as well as the length of time that the transistor allows a signal to pass through is therefore achieved.

Those of ordinary skill in the art will recognize that many modifications and variations of the present invention may be implemented without departing from the spirit or scope of the invention. Thus, it is intended that the present invention cover the modification and variations of this invention provided they come within the scope of the appended claims and their equivalents.

What is claimed is:

1. A device that emits pulses, the device comprising:
   a drive electrode;
   a cantilever, wherein the cantilever comprises:
   a piezoelectric layer;
   a first electrical conductor positioned on a first side of the piezoelectric layer; and
   a second electrical conductor positioned on a second side of the piezoelectric layer which is opposite the first side of the piezoelectric layer, wherein the cantilever oscillates between two mechanically-stressed states when a predetermined alternating voltage is applied between the drive electrode and the first electrical conductor, wherein the cantilever is in a mechanically-unstressed state when between the two mechanically-stressed states, and wherein the piezoelectric layer emits a plurality of pulses during the oscillation of the cantilever between the two mechanically-stressed states; and
   a third electrical conductor positioned in the vicinity of the cantilever, wherein the emitted pulses generate an electrical field that is impinged onto the third electrical conductor when the cantilever passes the third conductor during the oscillation of the cantilever between the two mechanically-stressed states, and wherein the impinged electrical field generates an induced current in the third conductor.

2. The device of claim 1, wherein the cantilever and the drive electrode are separated by a predetermined distance when the cantilever is in the mechanically-unstressed state.

3. The device of claim 1, wherein the emitted pulses include pulse components that are separated in time and produce a complete voltage cycle.

4. The device of claim 1, wherein a pulse width of the induced current in the third conductor is a subset of or equivalent to a pulse width of an impinged electrical field generated by the emitted pulses from the piezoelectric layer.

5. The device of claim 1, wherein the cantilever is a portion of either a dipole structure or an antenna structure and allows for cycling of pulses for generation of RF signals.

6. An array of the devices as per claim 5, wherein at least two devices within the array of devices are connected in series such that an emitted pulse from each device and its associated dipole structure or antenna structure is in phase with an emitted pulse from each of the other devices within the array of devices such that a resultant combination of emitted pulses from the devices is at a higher energy level than an emitted pulse from a single device within the array of devices.

7. An array of the devices as per claim 5, wherein at least two devices within the array of devices are connected in series such that an emitted pulse from each device and its associated dipole structure or antenna structure is in phase with an emitted. pulse from each of the other devices within the array of devices such that a resultant combination of emitted pulses from the devices is in temporal sequence such that pulse emissions from the array of devices appear as a continuous modulation thereby generating either amplitude modulation signals or pulse width modulation signals.

8. An array of the devices as per claim 1, wherein a delay is provided between the operations of each device within the array of devices such that the emitted pulses are capable of being combined on a common conduction line in a manner that generates continuous cycling pulses.

9. The array of devices as per claim 8, wherein the delay is caused by at least one item selected from the group consisting of control of timing or phase of the device, delay lines between the devices for a drive signal applied to the drive electrode, delay lines at an exit of the emitted pulses from each of the devices, and combinations thereof.

10. An array of the devices as per claim 1, wherein timing of an emission from one device within the array is in phase with an emission of another device within the array to create a higher magnitude pulse.

11. An array of the devices as per claim 1, wherein timing of a drive signal applied to the drive electrode generates the oscillation of the cantilever between the two mechanically-stressed states, wherein the timing of the drive signal is controlled by a combination of two cyclic wave signals, wherein the two cyclic wave signals are out of phase for only a portion of their cycles whereby the two cyclic wave signals cancel each other out when at opposite polarities such that remaining phase relationships produce pulses of shorter duration than each of the two cyclic wave signals when considered separately.

12. The array of devices as per claim 11, wherein at least one of the two cyclic wave signals is a square wave.

13. The device of claim 1 further comprising a diode having a barrier region, wherein at least one of the first electrical conductor or the second electrical conductor passes within the vicinity of the barrier region during the oscillation of the cantilever between the two mechanically-stressed states such that an electrical field from the cantilever establishes a potential voltage across the barrier region capable of breaking down the barrier region thereby providing an onset of current flow of the diode, and wherein the third electrical conductor provides an electrical field contact between the cantilever and the diode.

14. The device of claim 1 further comprising a transistor including a gate electrode and a barrier region, wherein at least one of the first electrical conductor or the second electrical conductor passes within the vicinity of the gate electrode during the oscillation of the cantilever between the two mechanically-stressed states such that an electrical field from the cantilever establishes a potential voltage across the gate electrode capable of breaking down the barrier region thereby providing a switching of the transistor, and wherein the third electrical conductor provides an electrical field contact between the cantilever and the transistor.

15. The device of claim 1, wherein the impinged electrical field is transferred to the third electrical conductor via hot electron transfer.

16. A device that emits pulses, the device comprising:
a drive electrode;
a cantilever, wherein the cantilever comprises:
    a piezoelectric layer;
    a first electrical conductor positioned on a first side of the piezoelectric layer; and
    a second electrical conductor positioned on a second side of the piezoelectric layer which is opposite the first side of the piezoelectric layer, wherein the cantilever oscillates between two mechanically-stressed states when a predetermined alternating voltage is applied between the drive electrode and the first electrical conductor, wherein the cantilever is in a mechanically-unstressed state when between the two mechanically-stressed states, and wherein the piezoelectric layer emits a plurality of pulses during the oscillation of the cantilever between the two mechanically-stressed states; and
third and fourth electrical conductors positioned in the vicinity of the cantilever, wherein the third and fourth electrical conductors are spaced from each other, wherein the emitted pulses generate an electrical field that is impinged onto the third and fourth electrical conductors when the cantilever passes the third and fourth electrical conductors during the oscillation of the cantilever between the two mechanically-stressed states, wherein the impinged electrical field generates an induced current in the third and fourth conductors corresponding to different positions of the cantilever during the oscillation of the cantilever between the two mechanically-stressed states, and wherein pulses corresponding to the electrical field impinged on the third and fourth conductors occur at different times and are therefore shifted in phase relative to each other.

17. The device of claim 16, wherein a phase delay between two pulses being generated by the passing of the cantilever by the third or fourth conductors generates a phase shift between the pulses such that when the pulses are added together they produce shorter wavelength pulses than the initial pulses.

18. A device that emits pulses, the device comprising:
a drive electrode;
a cantilever, wherein the cantilever comprises:
    a piezoelectric layer;
    a first electrical conductor positioned on a first side of the piezoelectric layer; and
    a second electrical conductor positioned on a second side of the piezoelectric layer which is opposite the first side of the piezoelectric layer, wherein the cantilever oscillates between two mechanically-stressed states when a predetermined alternating voltage is applied between the drive electrode and the first electrical conductor, wherein the cantilever is in a mechanically-unstressed state when between the two mechanically-stressed states, and wherein the piezoelectric layer emits a plurality of pulses during the oscillation of the cantilever between the two mechanically-stressed states; and
a diode having a barrier region, wherein at least one of the first electrical conductor or the second electrical conductor passes within the vicinity of the barrier region during the oscillation of the cantilever between the two mechanically-stressed states such that an electrical field from the cantilever establishes a potential voltage across the barrier region capable of breaking down the barrier region thereby providing an onset of current flow of the diode.

19. The device of claim 18, wherein the potential voltage across the barrier region is transferred via hot electron transfer.

20. The device of claim 18, wherein the cantilever is a portion of either a dipole structure or an antenna structure and allows for cycling of pulses for generation of RF signals.

21. An array of the devices as per claim 18, wherein a delay is provided between the operations of each device within the array of devices such that the emitted pulses are capable of being combined on a common conduction line in a manner that generates continuous cycling pulses.

22. The array of devices as per claim 21, wherein the delay is caused by at least one item selected from the group consisting of control of timing or phase of the device, delay lines between the devices for a drive signal applied to the drive electrode, delay lines at an exit of the emitted pulses from each of the devices, and combinations thereof.

23. An array of the devices as per claim 18, wherein timing of an emission from one device within the array is in phase with an emission of another device within the array to create a higher magnitude pulse.

24. An array of the devices as per claim 18, wherein timing of a drive signal applied to the drive electrode generates the oscillation of the cantilever between the two mechanically-stressed states, wherein the timing of the drive signal is controlled by a combination of two cyclic wave signals, wherein the two cyclic wave signals are out of phase for only a portion of their cycles whereby the two cyclic wave signals cancel each other out when at opposite polarities such that remaining phase relationships produce pulses of shorter duration than each of the two cyclic wave signals when considered separately.

25. An array of the devices as per claim 18, wherein pulses from each diode are combined out of phase to make shorter pulses.

26. An array of devices that emits pulses, each device within the array comprising:
a drive electrode;
a cantilever, wherein the cantilever comprises:
    a piezoelectric layer;
    a first electrical conductor positioned on a first side of the piezoelectric layer; and
    a second electrical conductor positioned on a second side of the piezoelectric layer which is opposite the first side of the piezoelectric layer, wherein the cantilever oscillates between two mechanically-stressed states when a predetermined alternating voltage is applied between the drive electrode and the first electrical conductor, wherein the cantilever is in a mechanically-unstressed state when between the two mechanically-stressed states, and wherein the piezoelectric layer emits a plurality of pulses during the oscillation of the cantilever between the two mechanically-stressed states; and a transistor including a gate electrode and a barrier region, wherein at least one of the first electrical conductor or the second electrical conductor passes within the vicinity of the gate electrode during the oscillation of the cantilever between the two mechanically-stressed states such that an electrical field from the cantilever establishes a potential voltage across the gate electrode capable of breaking down the baffler region thereby providing a switching of the transistor;

wherein a delay is provided between the operations of each device within the array of devices such that the emitted pulses are capable of being combined on a common conduction line in a manner that generates continuous cycling pulses.

27. The device of claim 26, wherein the potential voltage across the gate electrode is transferred via hot electron transfer.

28. The device of claim 26, wherein the cantilever is a portion of either a dipole structure or an antenna structure and allows for cycling of pulses for generation of RF signals.

29. The array of devices as per claim 26, wherein the delay is caused by at least one item selected from the group consisting of control of timing or phase of the device, delay lines between the devices for a drive signal applied to the drive electrode, delay lines at an exit of the emitted pulses from each of the devices, and combinations thereof.

30. An array of the devices as per claim 26, wherein timing of a drive signal applied to the drive electrode generates the oscillation of the cantilever between the two mechanically-stressed states, wherein the timing of the drive signal is controlled by a combination of two cyclic wave signals, wherein the two cyclic wave signals are out of phase for only a portion of their cycles whereby the two cyclic wave signals cancel each other out when at opposite polarities such that remaining phase relationships produce pulses of shorter duration than each of the two cyclic wave signals when considered separately.

31. An array of devices that emits pulses, each device within the array comprising:
a drive electrode;
a cantilever, wherein the cantilever comprises:
  a piezoelectric layer;
  a first electrical conductor positioned on a first side of the piezoelectric layer; and
  a second electrical conductor positioned on a second side of the piezoelectric layer which is opposite the first side of the piezoelectric layer, wherein the cantilever oscillates between two mechanically-stressed states when a predetermined alternating voltage is applied between the drive electrode and the first electrical conductor, wherein the cantilever is in a mechanically-unstressed state when between the two mechanically-stressed states, and wherein the piezoelectric layer emits a plurality of pulses during the oscillation of the cantilever between the two mechanically-stressed states; and a transistor including a gate electrode and a barrier region, wherein at least one of the first electrical conductor or the second electrical conductor passes within the vicinity of the gate electrode during the oscillation of the cantilever between the two mechanically-stressed states such that an electrical field from the cantilever establishes a potential voltage across the gate electrode capable of breaking down the barrier region thereby providing a switching of the transistor;

wherein timing of an emission from one device within the array is in phase with an emission of another device within the array to create a higher magnitude pulse.

32. The device of claim 31, wherein-the potential voltage across the gate electrode is transferred via hot electron transfer.

33. An array of devices that emits pulses, each device within the array comprising:
a drive electrode;
a cantilever, wherein the cantilever comprises:
  a piezoelectric layer;
  a first electrical conductor positioned on a first side of the piezoelectric layer; and
  a second electrical conductor positioned on a second side of the piezoelectric layer which is opposite the first side of the piezoelectric layer, wherein the cantilever oscillates between two mechanically-stressed states when a predetermined alternating voltage is applied between the drive electrode and the first electrical conductor, wherein the cantilever is in a mechanically-unstressed state when between the two mechanically-stressed states, and wherein the piezoelectric layer emits a plurality of pulses during the oscillation of the cantilever between the two mechanically-stressed states; and a transistor including a gate electrode and a barrier region, wherein at least one of the first electrical conductor or the second electrical conductor passes within the vicinity of the gate electrode during the oscillation of the cantilever between the two mechanically-stressed states such that an electrical field from the cantilever establishes a potential voltage across the gate electrode capable of breaking down the barrier region thereby providing a switching of the transistor;

wherein pulses from each transistor are combined out of phase to make shorter pulses.

34. The device of claim 33, wherein the potential voltage across the gate electrode is transferred via hot electron transfer.

* * * * *